United States Patent
Wu et al.

(10) Patent No.: US 6,275,390 B1
(45) Date of Patent: Aug. 14, 2001

(54) SHIELD FOR ELECTRONIC COMPONENTS ON A CIRCUIT BOARD

(75) Inventors: Kun-Tsan Wu; Nan-Tsung Huang, both of Tu-Chen; Fu-Keng Yang, Taipei, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/422,122

(22) Filed: Oct. 20, 1999

(30) Foreign Application Priority Data

Jul. 30, 1999 (TW) .................................................. 88212811

(51) Int. Cl.[7] ..................................................... H05K 9/00
(52) U.S. Cl. ......................... 361/818; 361/814; 361/736; 455/347
(58) Field of Search ..................................... 361/818, 800, 361/814, 816, 736, 737; 379/428, 429; 174/35 R; 455/89, 90, 300, 347; 307/89–91

(56) References Cited

U.S. PATENT DOCUMENTS

| | | | |
|---|---|---|---|
| 5,150,282 | * 9/1992 | Tomura et al. | 361/818 |
| 5,546,278 | * 8/1996 | Bethurum | 361/737 |
| 5,596,487 | * 1/1997 | Castaneda et al. | 361/814 |
| 5,764,492 | * 6/1998 | Ady et al. | 361/818 |
| 6,122,178 | * 9/2000 | Andrews et al. | 361/800 |

* cited by examiner

*Primary Examiner*—Leo P. Picard
*Assistant Examiner*—Hung Van Duong
(74) *Attorney, Agent, or Firm*—Wei Te Chung

(57) ABSTRACT

An EMI shield is used for shielding electronic components on a printed circuit board of a mobile phone. The shield comprises a cover and a pair of grounding strips, all being made by conductive material. The pair of grounding strips is soldered on the printed circuit board. A plurality of latches is formed on each grounding strip. The cover, which is substantially in the shape of an inverted U, comprises a shielding plate and a pair of rims depending downward from opposite sides of the shielding plate. A plurality of openings defined in the rims engages with respective latches of the grounding strips to secure the cover to the printed circuit board.

5 Claims, 4 Drawing Sheets

SHIELD FOR ELECTRONIC COMPONENTS ON A CIRCUIT BOARD

BACKGROUND OF THE INVENTION

The present invention relates to an EMI shield for shielding electronic components on a printed circuit board of a mobile phone, and particularly to an EMI shield having a portion which can be easily detached from the printed circuit so that a repair or replacement of the electronic components can be readily achieved.

A mobile phone is subject to external EMI which can result in signal distortion. Thus, EMI sensitive electronic components on a printed circuit board of a mobile phone are protected by a shield from EMI. Referring to FIG. 6, a conventional EMI shield 8 in a mobile phone (not labeled) usually comprises a rectangular lidless box fixed upside down on a circuit board 9. The shield is unitarily formed and covers a portion of the printed circuit board which mounts EMI sensitive electronic components (not labeled) in the mobile phone. Since the shield is soldered to the printed circuit board, disassembling it from the printed circuit board in order to repair/replace the electronic components requires a desoldering operation, which is very troublesome.

BRIEF SUMMARY OF THE INVENTION

A main object of the present invention is to provide a shield for use in a mobile phone, which has a portion can be easily detached from a printed circuit board, thereby simplifying repairing or replacing the electronic components on the printed circuit board.

Accordingly, an EMI shield in accordance with the present invention being mounted to a printed circuit board in a mobile phone comprises a conductive cover and a pair of grounding strips. The grounding strips are soldered to grounding circuit of the printed circuit board and spaced apart from each other a distance. A plurality of latches are formed on each grounding strip. The conductive cover has an inverted-U shape and includes a shielding plate and a pair of rims. The shielding plate forms a plurality of tabs which cooperate with the rims to define two channels in the cover. Each rim defines a number of openings. The cover is mounted to the printed circuit board by extending the two grounding strips into the two channels to reach a position in which the latches fit into the openings, whereby the grounding strips and the cover shield electronic components on the printed circuit board. The cover can be easily removed from the printed circuit board by releasing the fit between the latches and openings, whereby the electronic components can be repaired/replaced, without the necessity of a desoldering operation.

Other objects, advantages and novel features of the invention will become more apparent from the following detailed description when taken in conjunction with the accompanying drawings.

DETAILED DESCRIPTION OF THE INVENTION

Figure 1:
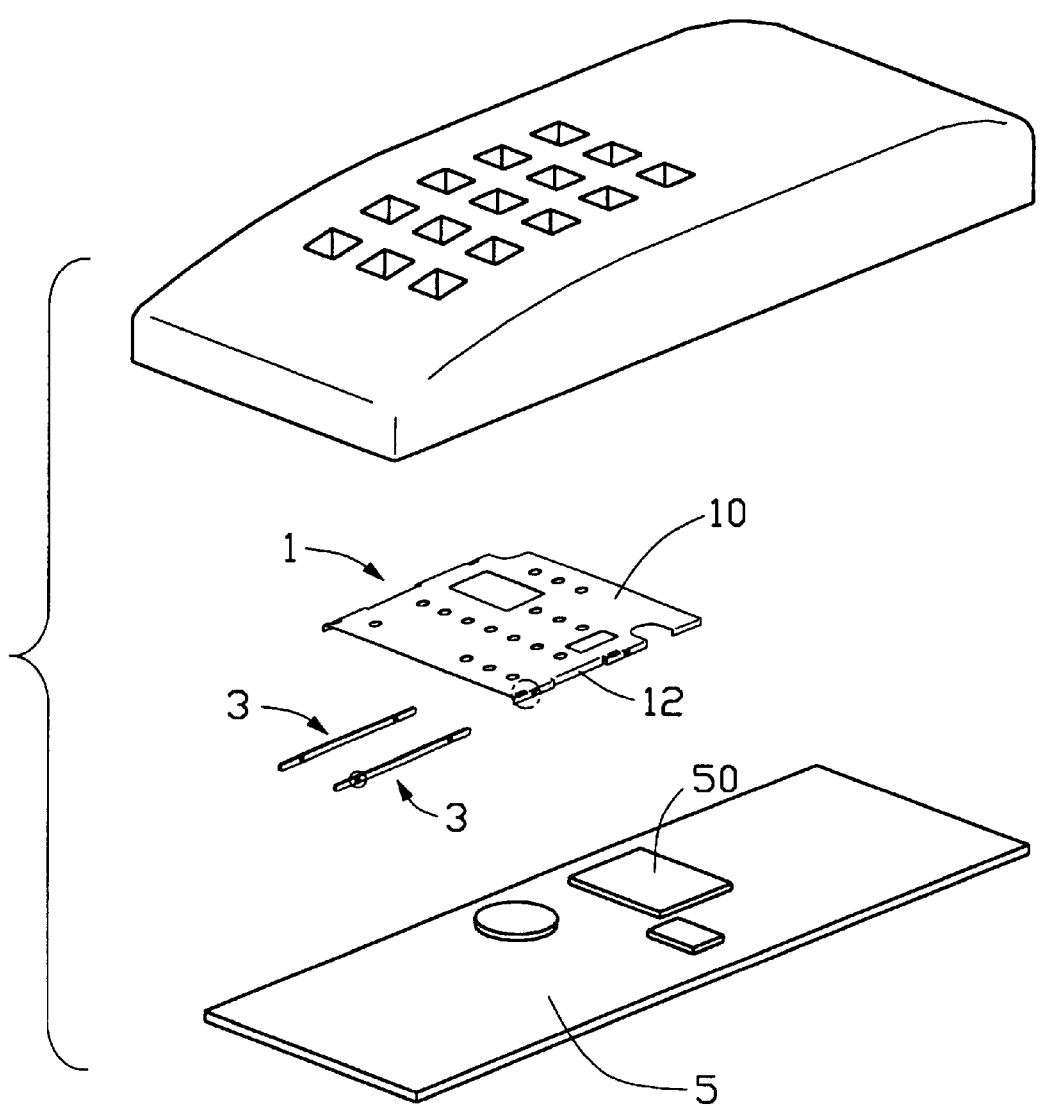
FIG. 1 is an exploded view of a portion of a mobile phone including an EMI shield in accordance with the present invention.
Figure 2:
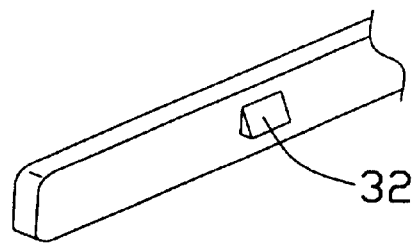
FIG. 2 is a partially enlarged view of a grounding strip of the EMI shield of FIG. 1.
Figure 3:
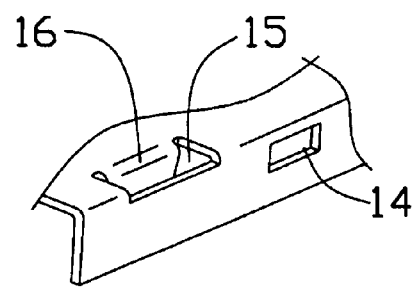
FIG. 3 is a partially enlarged view of a rim of a cover of the EMI shield of FIG. 1.

Referring to FIGS. 1 to 3, an EMI shield of the present invention is mounted on a printed circuit board 5 of a mobile phone, shielding electronic components 50 thereon. The EMI shield comprises a cover 1 and a pair of elongated grounding strips 3, all being made by conductive material. The cover 1 has an inverted U-shaped configuration comprising a rectangular shielding plate 10 and a pair of rims 12 depending downward from opposite sides of the shielding plate 10. Each rim 12 defines a plurality of openings 14. A resilient tab 16 extends inward and downward from the shielding plate 10 near a corresponding rim 12 of the cover 1 and beside a corresponding opening 14. The tabs 16 and a corresponding rim 12 together define a guiding channel 15 therebetween.

Each grounding strip 3 is formed with a plurality of latches 32 having a number corresponding to that of the openings 14 in each rim 12.

Figure 5:
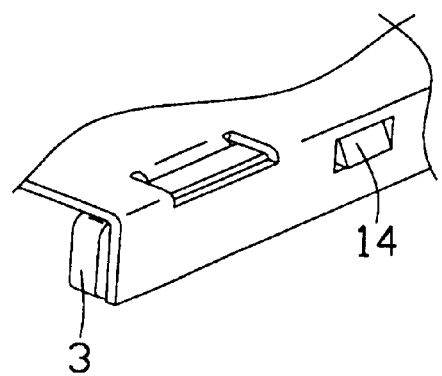
FIG. 5 is similar to FIG. 3, wherein the grounding strip is assembled to the rim.
Figure 4:
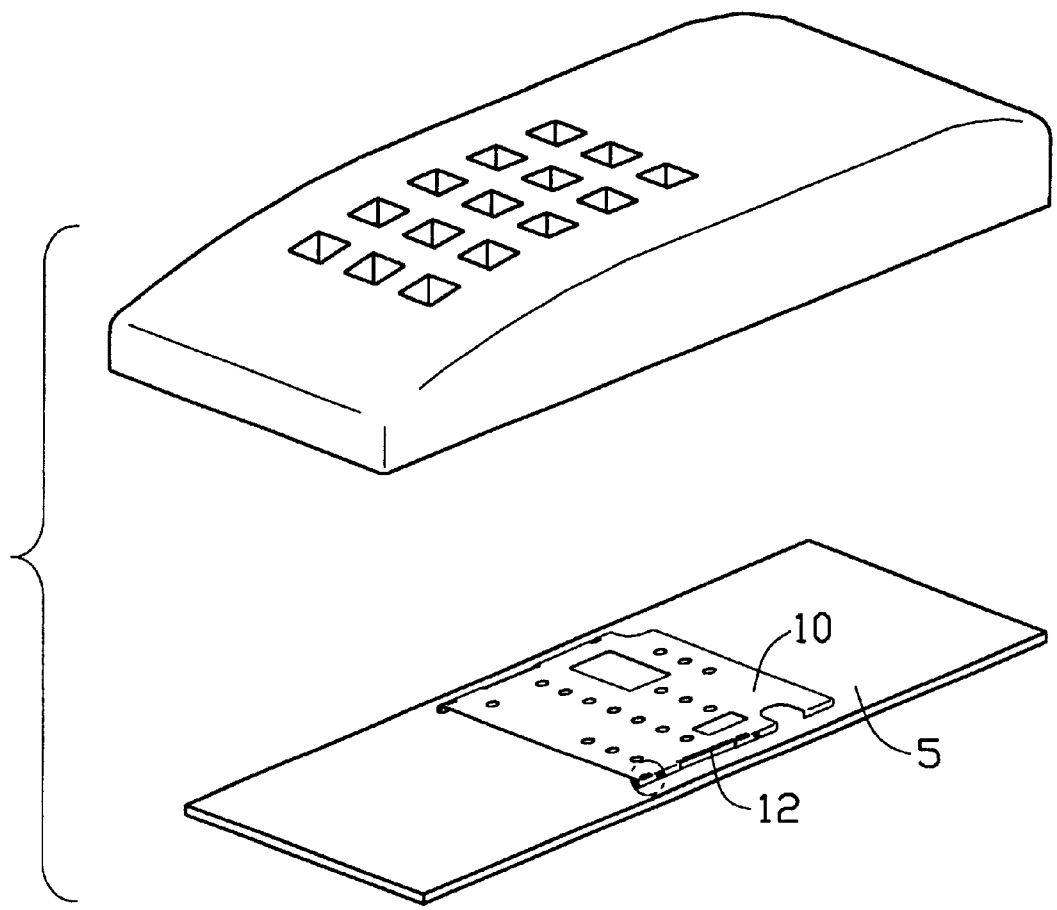
FIG. 4 is a view similar to FIG. 1 with the EMI shield being assembled to a circuit board.
Figure 6:
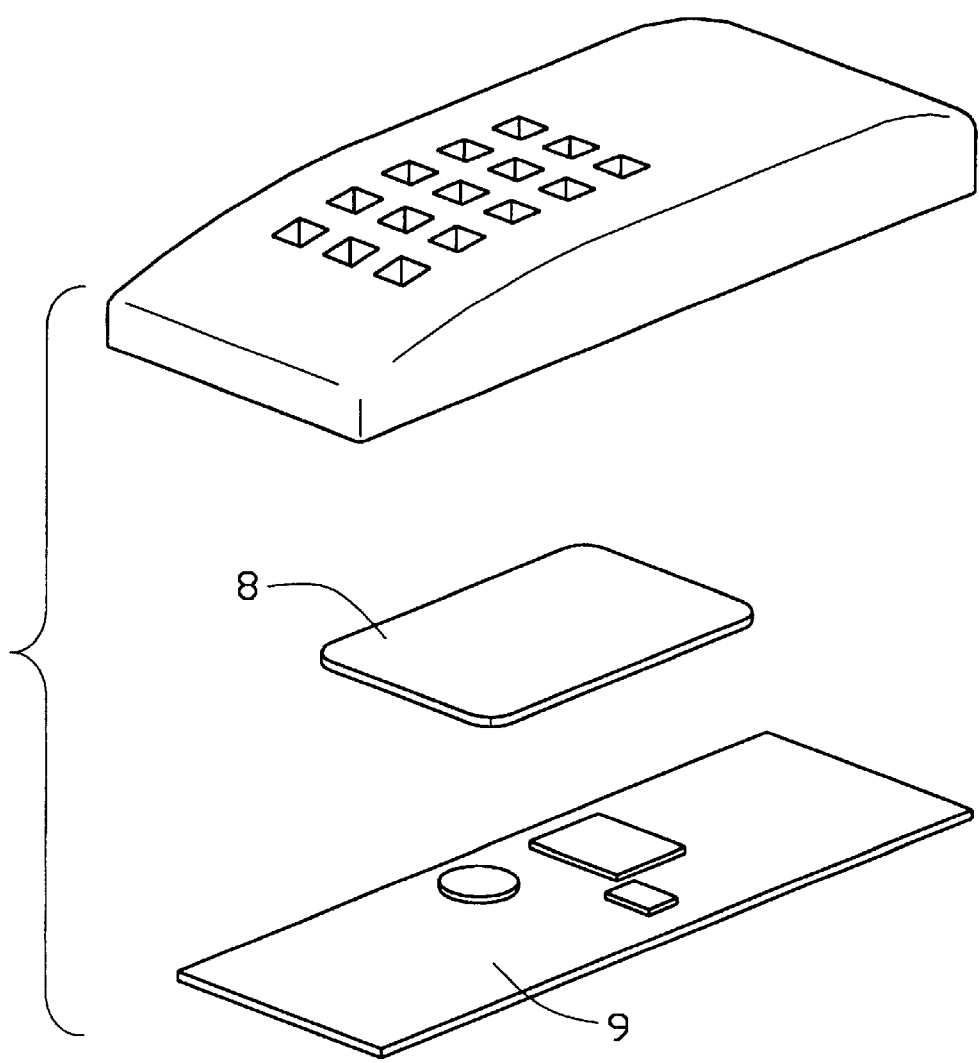
FIG. 6 is a view similar to FIG. 1 showing a portion of a mobile phone including a conventional EMI shield.

In assembly, referring to FIGS. 4 and 5, the shield 1 of the present invention is mounted on the printed circuit board 5 of a mobile phone to enclose the electronic components 50 thereon. Firstly, the grounding strips 3 are soldered to appropriate positions of the printed circuit board 5 spaced apart from each other a distance substantially the same as a width of the cover 1 between the rims 12. The grounding strips 3 are electrically connected with grounding circuit on the printed circuit board 5. Then, the cover 1 is mounted to the grounding strips 3 by extending the grounding strips 3 into the corresponding guiding channels 15 to reach a position in which the latches 32 fit into the openings 14 and the grounding strips 3 are sandwiched between the rims 12 and the tabs 16. Thus, the shield is mounted to the printed circuit board 5.

When one of the electronic components 50 mounted on the printed circuit board 5 needs to be repaired or replaced, all one has to do is releasing the fitting between the cover 1 and the grounding strips 3, without the necessity of any desoldering operation.

In an alternative embodiment, although not shown in the drawings, it can be understood by those skilled in the art, the latches 32 may be formed on the rims 12 of the cover 1, while the openings 14 are correspondingly defined in the grounding strips 3. Additionally, the latches 32 and openings 14 may be one or more in number.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A shield device for shielding electronic components mounted on a printed circuit board, comprising:

a pair of grounding strips being secured to a printed circuit board;

a conductive cover shielding electronic components provided on the circuit board, the conductive cover having a shielding plate and a pair of rims depending downward from the shielding plate; and means for releasably engaging the rims of the conductive cover with the grounding strips, wherein the means for releasably engaging includes a latch formed on each grounding strip and an opening defined in each rim of the conductive cover for receiving the latch.

2. The shield device as claimed in claim 1, wherein the pair of grounding strips are soldered to the printed circuit board and spaced apart from each other.

3. The shield device as claimed in claim 1, herein a tab extending downward from the shielding plate of the conductive cover is provided to cooperate with an adjacent rim to define a guiding channel.

4. A mobile phone comprising:

a printed circuit board with a plurality of electronic components mounted thereon;

a pair of strips securely attached unto the printed circuit board by two sides of said electronic components;

a conductive cover including an electrically shielding plate and a pair of downwardly extending rims on two sides of said electrically shielding plate, a transverse dimension of said electrically shielding plate being compliant with a distance between the pair of strips wherein said cover is detachably engaged with the corresponding pair of strips, respectively, and the cover electrically shields the electronic components under the electrically shielding plate thereof.

5. A shield device for shielding electronic components mounted on a printed circuit board, comprising:

a pair of grounding strips being secured to a printed circuit board;

a conductive cover shielding electronic components provided on the circuit board, the conductive cover having a shielding plate and a pair of rims depending downward from the shielding plate; and means for releasably engaging the rims of the conductive cover with the grounding strips, wherein the means for releasably engaging includes a latch formed on each rim of the conductive cover and an opening defined in each grounding strip for receiving the latch.

* * * * *